US009497822B2

(12) United States Patent
Miyoshi (10) Patent No.: US 9,497,822 B2
(45) Date of Patent: Nov. 15, 2016

(54) SEMICONDUCTOR LIGHT SOURCE DRIVING APPARATUS AND PROJECTION TYPE DISPLAY APPARATUS

(71) Applicant: Panasonic Intellectual Property Management Co., Ltd., Osaka (JP)

(72) Inventor: Shinji Miyoshi, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/943,065

(22) Filed: Nov. 17, 2015

(65) Prior Publication Data

US 2016/0143100 A1    May 19, 2016

(30) Foreign Application Priority Data

Nov. 19, 2014  (JP) ................. 2014-234164
Oct. 13, 2015  (JP) ................. 2015-201682

(51) Int. Cl.
*H05B 33/08*  (2006.01)
*G03B 21/20*  (2006.01)
*H01S 5/068*  (2006.01)

(52) U.S. Cl.
CPC ......... *H05B 33/089* (2013.01); *G03B 21/2033* (2013.01); *G03B 21/2053* (2013.01); *H01S 5/06825* (2013.01); *H05B 33/083* (2013.01)

(58) Field of Classification Search
CPC .............. H04B 10/04; H05B 33/0827; H05B 33/0845; H05B 33/089; H05B 33/0815; H05B 33/083
USPC ....... 315/186, 193, 291, 122, 307, 294, 312, 315/77, 185 R, 82, 224; 398/201
See application file for complete search history.

(56) References Cited

U.S. PATENT DOCUMENTS

| | | | | |
|---|---|---|---|---|
| 9,137,873 B2* | 9/2015 | Bradford | ............ | H05B 33/0893 |
| 2007/0159750 A1* | 7/2007 | Peker | ............... | H05B 33/0869 |
| | | | | 361/93.1 |
| 2014/0361696 A1* | 12/2014 | Siessegger | ......... | H05B 33/0803 |
| | | | | 315/186 |

FOREIGN PATENT DOCUMENTS

| | | |
|---|---|---|
| JP | 2002-025784 | 1/2002 |
| JP | 2009-302295 | 12/2009 |
| JP | 2012-014879 | 1/2012 |

*Primary Examiner* — Douglas W Owens
*Assistant Examiner* — Wei Chan
(74) *Attorney, Agent, or Firm* — Wenderoth, Lind & Ponack, L.L.P.

(57) ABSTRACT

A semiconductor light source driving apparatus includes a light source unit which has a plurality of series-connected light source modules. Each light source module includes: a switching element which is controlled to turn on/off by a control signal; series-connected light source elements; and an overvoltage detection circuit in which a zener diode and a light emitting element are connected in series and a light detecting element is disposed to face the light emitting element, the switching element, the light source elements, and the overvoltage detection circuit being connected in parallel to each other. The semiconductor light source driving apparatus further includes: a DC (Direct Current) power supply which supplies a DC voltage to the light source unit; a switching element driving unit which drives the switching element of each of the light source modules to turn on/off the switching element; and a controller which controls the switching element driving unit so that the switching element is turned on according to detection of light by the light detecting element.

7 Claims, 6 Drawing Sheets

SEMICONDUCTOR LIGHT SOURCE DRIVING APPARATUS AND PROJECTION TYPE DISPLAY APPARATUS

BACKGROUND

1. Technical Field

The present disclosure relates to a semiconductor light source driving apparatus which drives semiconductor light source elements such as light emitting diodes and laser diodes, and a projection type display apparatus using the semiconductor light source driving apparatus.

2. Description of the Related Art

Unexamined Japanese Patent Publication No. 2009-302295 discloses a semiconductor light source driving apparatus capable of continuously driving series-connected light emitting diodes which have no disconnection failure to emit light and capable of informing a user of disconnection failure, even after disconnection failure occurs in one or more of the series-connected light emitting diodes.

The semiconductor light source driving apparatus includes: a plurality of series-connected light emitting diodes; a power supply circuit which supplies electric power to the series-connected light emitting diodes; and a detector which detects disconnection when the disconnection occurs in any one of the light emitting diodes. Further, the semiconductor light source driving apparatus includes resistors connected in parallel to the light emitting diodes, switching elements connected to the resistors in series, and an informing unit which informs disconnection.

The semiconductor light source driving apparatus further includes a controller which controls the switching element so that when disconnection occurs in any one of light emitting diodes, a current flows through the resistor connected in parallel to the light emitting diode having the disconnection. This arrangement enables lighting operation of the light emitting diodes other than the light emitting diode in which disconnection occurs. Then, the controller provided in the semiconductor light source driving apparatus controls the informing unit to inform the user of the disconnection.

By such a configuration, even after disconnection failure occurs in one or more of the series-connected light emitting diodes, the light emitting diodes having no disconnection failure can continuously be driven to emit light and the disconnection failure can be informed a user.

SUMMARY

A semiconductor light source driving apparatus according to the present disclosure includes a light source unit which has a plurality of series-connected light source modules. Each of the light source modules includes: a switching element which is controlled to turn on/off by a control signal; one or a plurality of series-connected light source elements; and an overvoltage detection circuit in which a zener diode and a light emitting element are connected in series and a light detecting element is disposed to face the light emitting element, the switching element, the light source elements, and the overvoltage detection circuit being connected in parallel to each other. The semiconductor light source driving apparatus further includes: a DC power supply unit which supplies a DC voltage to the light source unit; a switching element driving unit which drives the switching element of each of the light source modules to turn on/off the switching element; and a controller which controls the switching element driving unit so that the switching element included in each of the light source modules is turned on according to detection of light by the light detecting element included in the same light source module.

The semiconductor light source driving apparatus of the present disclosure which drives a plurality of series-connected semiconductor light source elements can continuously drive semiconductor light source elements, which have no disconnection failure, to emit light, even when one or more of the series-connected semiconductor light source elements have disconnection failure.

DETAILED DESCRIPTION

Exemplary embodiments will be described in detail below with reference to the drawings as necessary. However, it is noted that an unnecessarily detailed description may be omitted. For example, a detailed description of already well-known matters or an overlapping description of substantially the same configuration may be omitted. This is to avoid the following description from unnecessarily becoming redundant and facilitate understanding by those skilled in the art.

It is noted that the inventor provides the accompanying drawings and the following description in order for those skilled in the art to thoroughly understand the present disclosure, and thus, it is not intended that the subject matter described in the claims is limited thereby.

First Exemplary Embodiment

Hereinafter, a first exemplary embodiment will be described with reference to FIG. 1 to FIG. 4.

[1-1. Configuration]

[1-1-1. Overall Configuration]

Figure 1:
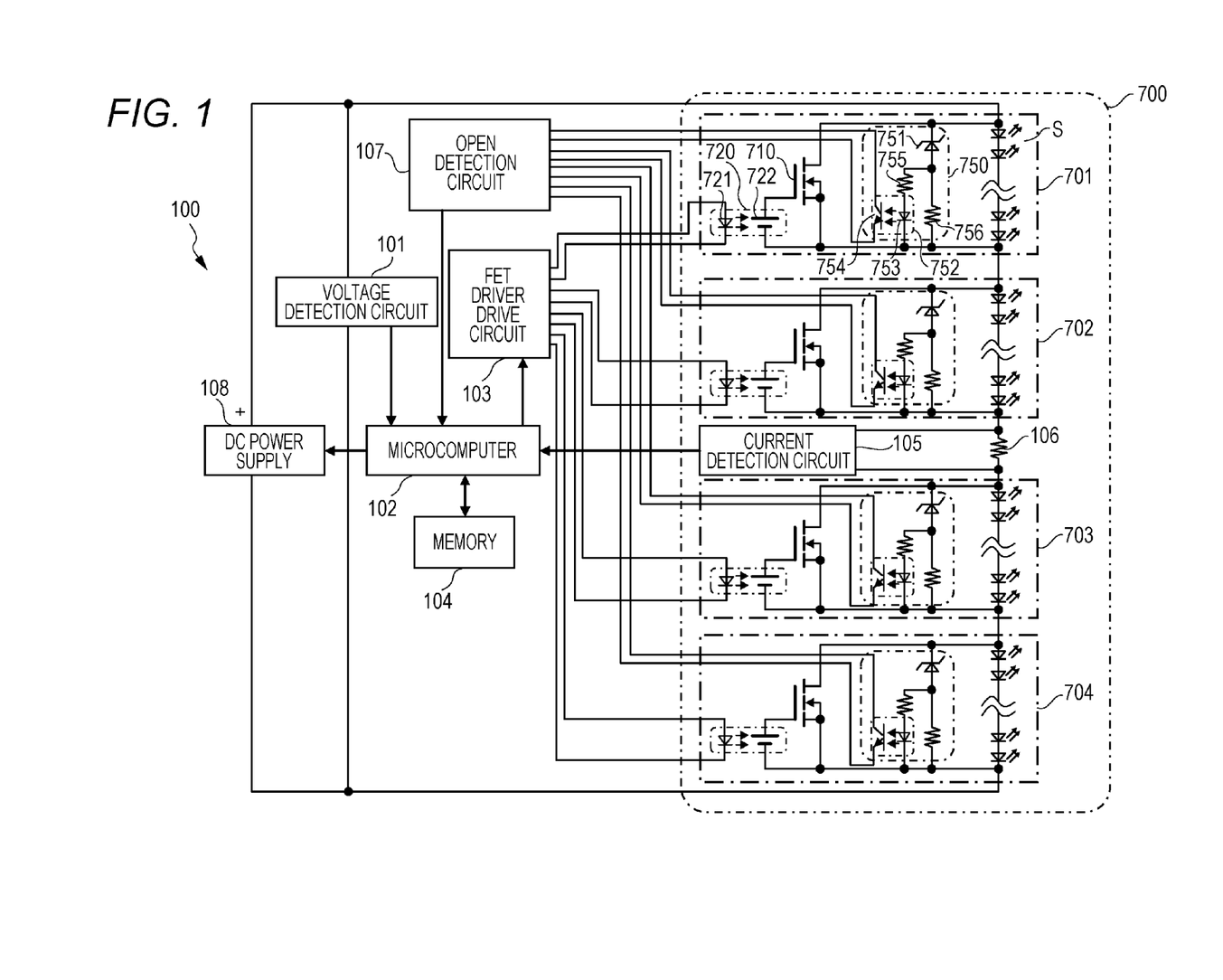
FIG. 1 is a block diagram illustrating a configuration of a semiconductor light source driving apparatus according to a first exemplary embodiment.

FIG. 1 is a block diagram illustrating a configuration of a semiconductor light source driving apparatus according to a first exemplary embodiment. Semiconductor light source driving apparatus 100 includes a plurality of light source modules 701-704, and current detection circuit 105 which detects currents flowing in light source modules 701-704. Further, semiconductor light source driving apparatus 100 includes open detection circuit 107 which informs microcomputer 102 which is a controller, of information concerning a light source module having disconnection failure, based on a disconnection detection signal from any one of the light source modules having the disconnection failure, and FET (Field Effect Transistor) driver drive circuit 103 being a switching element driving unit which short-circuits the light source module having the disconnection failure. Further, semiconductor light source driving apparatus 100 includes DC (Direct Current) power supply (DC power supply circuit) 108 which supplies driving power to the plurality of light source modules 701-704, voltage detection circuit 101 which detects a voltage of DC power supply 108, microcomputer 102 which controls DC power supply 108 and FET driver drive circuit 103, and memory 104 connected to microcomputer 102.

Each of light source modules 701-704 includes a circuit in which a plurality of series-connected semiconductor light source elements S, N-channel FET 710 being a switching element, and overvoltage detection circuit 750 are connected in parallel to each other. That is, each of the semiconductor light source elements S being the plurality of series-connected light source elements and overvoltage detection circuit 750 are connected between a drain and a source of N-channel FET 710.

Overvoltage detection circuit 750 includes: a circuit in which zener diode 751, current limiting resistor 755, and LED (light emitting diode) 753 being a light emitting element are connected in series; phototransistor 754 being a light detecting element disposed to face LED 753; and current limiting resistor 756 connected in parallel to a series circuit of current limiting resistor 755 and LED 753. LED 753 and phototransistor 754 configure photo-coupler 752. Both ends of phototransistor 754 are connected to open detection circuit 107, and a voltage across phototransistor 754 is output as a disconnection detection signal. Details of overvoltage detection circuit 750 will be described later.

Further, each of light source modules 701-704 includes FET driver 720. FET driver 720 includes LED 721 and photoelectric cell 722, and an output of photoelectric cell 722 is connected between a gate and the source of N-channel FET 710.

For semiconductor light source element S, a laser diode can be used, for example. Four light source modules are connected in series as an example. It is assumed that 16 semiconductor light source elements S are respectively connected to light source modules 701-704 in series.

Four series-connected light source modules 701-704 compose light source unit 700. In light source unit 700, current detection resistor 106 is connected in series between light source module 702 and light source module 703. Current detection circuit 105 detects a current flowing in each of light source modules 701-704. Specifically, current detection circuit 105 amplifies a voltage across current detection resistor 106, and informs microcomputer 102 of the amplified voltage as information concerning the current flowing in each of light source modules 701-704.

DC power supply 108 applies a voltage for driving light source modules 701-704 across light source unit 700 to which current detection resistor 106 is connected in series.

Voltage detection circuit 101 detects an output voltage of DC power supply 108, and informs microcomputer 102 of the detected output voltage.

Open detection circuit 107 is connected to overvoltage detection circuit 750 in each of light source modules 701-704. Open detection circuit 107 detects a disconnection detection signal from each of four overvoltage detection circuits 750, and informs microcomputer 102 of the detected disconnection detection signal.

FET driver drive circuit 103 drives LEDs 721 of FET drivers 720 of light source modules 701-704 to emit light to make photoelectric cell 722 generate electromotive force, based on a control signal from microcomputer 102. Thus, a gate potential of N-channel FET 710 of each of light source modules 701-704 is controlled to control ON/OFF (ON state/OFF state) of N-channel FET 710. That is, N-channel FET 710 is controlled to turn on/off by the control signal from microcomputer 102.

Microcomputer 102 inputs the outputs of open detection circuit 107, voltage detection circuit 101, and current detection circuit 105, and controls DC power supply 108, FET driver drive circuit 103, and memory 104. Microcomputer 102 may be configured by a dedicated hardware circuitry designed to realize at least the function explained below, or include CPU and MPU which executes a program for realizing at least the function which is explained below.

Memory 104 is a storage device which stores information indicating any one of light source modules 701-704 in which disconnection failure occurs, and is, for example, a flash memory.

Figure 2:
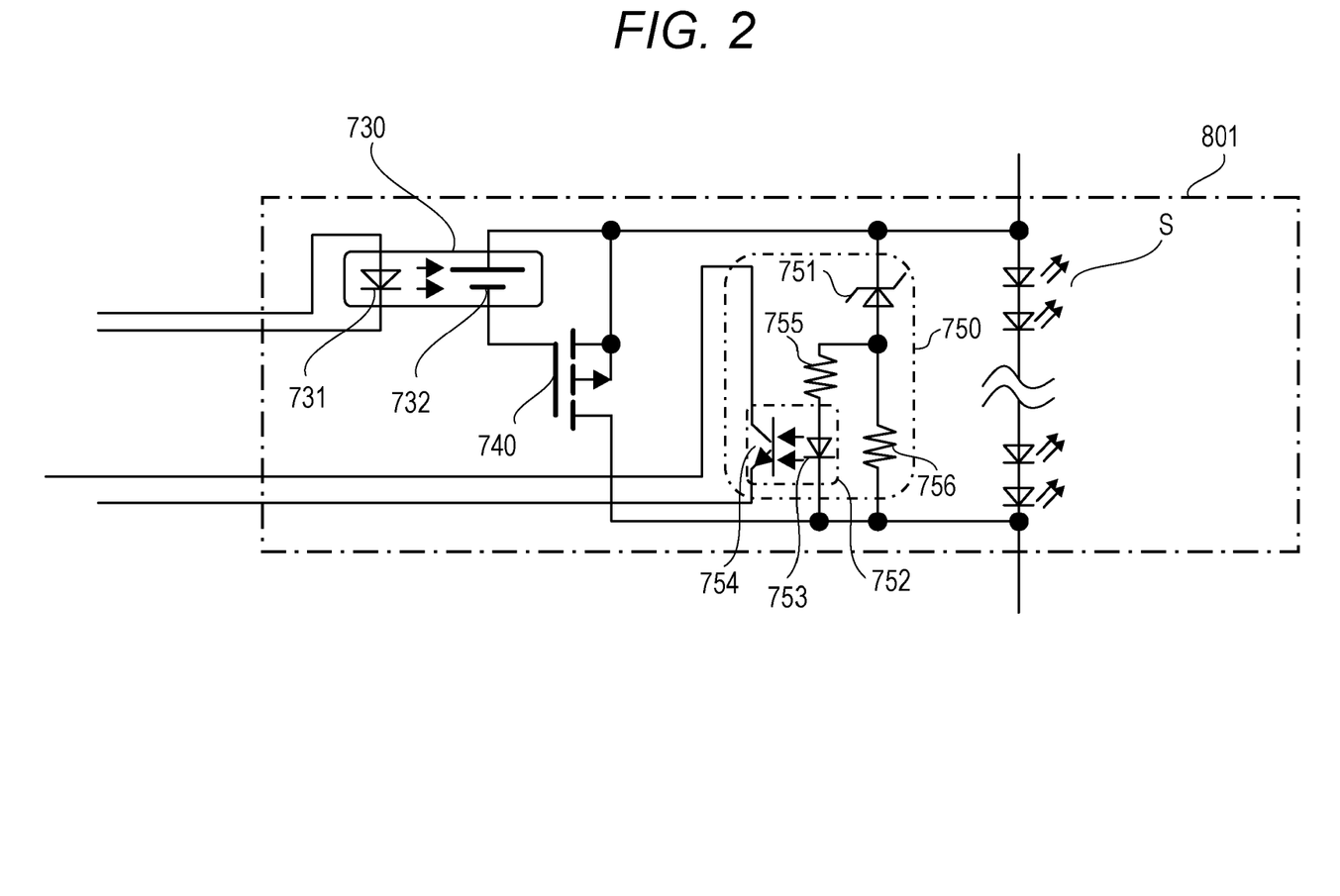
FIG. 2 is a circuit diagram illustrating another example of a configuration of a light source module of the semiconductor light source driving apparatus according to the first exemplary embodiment.

FIG. 2 is a diagram illustrating another example of a configuration of a light source module which can be used in semiconductor light source driving apparatus 100 in the first exemplary embodiment. In the configuration example illustrated in FIG. 1, N-channel FET 710 being a switching element is used to short-circuit a semiconductor light source element string. On the other hand, in the example illustrated in FIG. 2, P-channel FET 740 being a switching element is used.

Light source module 801 illustrated in FIG. 2 includes a plurality of series-connected semiconductor light source elements S, P-channel FET 740 which is connected in parallel to the series circuit of the plurality of semiconductor light source elements S, and FET driver 730. FET driver 730 includes LED 731 and photoelectric cell 732 with an output of photoelectric cell 732 connected between a gate and a source of P-channel FET 740. Overvoltage detection circuit 750 has a configuration similar to that of each of light source modules 701-704 illustrated in FIG. 1. Light source module 801 illustrated in FIG. 2 has a function equivalent to that of each of light source modules 701-704 illustrated in FIG. 1.

[1-1-2. Configuration of Overvoltage Detection Circuit]

Overvoltage detection circuit 750 detects disconnection failure of a semiconductor light source element S included in the same light source module. When disconnection failure occurs in the semiconductor light source element S, zener diode 751 is turned on, and LED 753 starts emitting light. Then, phototransistor 754 is turned on by light emission of LED 753. Open detection circuit 107 detects that phototransistor 754 is turned on. In this way, overvoltage detection circuit 750 can detect disconnection failure of the semiconductor light source element S, and can inform open detection circuit 107 of the disconnection failure.

Next, characteristics of zener diode 751, and current limiting resistors 755, 756 used in the present exemplary embodiment will be described in detail.

For zener diode 751 inserted between the drain and the source of N-channel FET 710 in each of light source modules 701-704, there is used a zener diode which has a breakdown voltage higher than a voltage that occurs in the series circuit of the semiconductor light source elements S during light emission of each of light source modules 701-704.

Because the breakdown voltage of zener diode 751 is higher than the voltage generated in the series circuit of the semiconductor light source elements S, when no disconnection failure occurs in the semiconductor light source element S, a current does not flow in zener diode 751, and does not flow in current limiting resistors 755, 756, either. Therefore, unnecessary power loss does not occur in current limiting resistors 755, 756 and zener diode 751.

On the other hand, when disconnection failure occurs in the semiconductor light source element S, impedance of a series circuit of the semiconductor light source elements S in any one of light source modules 701-704 having the disconnection failure becomes high, so that a voltage from DC power supply 108 is concentrated on and applied to the series circuit of the semiconductor light source elements S. Consequently, a voltage applied to zener diode 751 becomes higher than the breakdown voltage, and zener diode 751 is turned on and a current flows.

In order to reduce power consumption consumed in zener diode 751 and current limiting resistors 755, 756, resistance values of current limiting resistors 755, 756 are set to resistance values which cause a current, which flows when zener diode 751 is turned on due to occurrence of disconnection failure, to become smaller than currents which flow in light source modules 701-704 when no disconnection failure occurs. By setting the resistance value to such a value, a device having small-rated power consumption can be used for zener diode 751 and current limiting resistors 755, 756.

When disconnection failure occurs, in order to effectively reduce a voltage to be applied across overvoltage detection circuit 750, that is, a voltage to be applied between the drain and the source of N-channel FET 710, resistance values of current limiting resistors 755, 756 are set as follows. Specifically, the resistance values of current limiting resistors 755, 756 are set such that when disconnection failure occurs in one of light source modules 701-704, the resistance values cause a specific voltage to be applied across each of other light source modules 701-704 having no disconnection failure. The specific voltage is a voltage equal to or larger than 20% of a voltage across each of light source modules 701-704 to be applied when no disconnection failure occurs in all of light source modules 701-704. In this case, normally, a current of mA order flows in other light source modules 701-704 having no disconnection failure.

The voltage applied between the drain and the source of N-channel FET 710 of any one of light source modules 701-704 having disconnection failure is an output voltage of DC power supply 108 minus a voltage of other light source modules 701-704 having no disconnection failure. Accordingly, by setting resistance values of current limiting resistors 755, 756 in the manner as described above, a voltage applied between the drain and the source of N-channel FET 710 of any one of light source modules 701-704 having disconnection failure becomes smaller than a voltage which occurs when overvoltage detection circuit 750 is not connected. For this reason, N-channel FET 710 having a low withstanding voltage can be used. Therefore, on-resistance of N-channel FET 710 becomes small, and thus loss generating when N-channel FET 710 is turned on can be reduced.

Further, in a configuration using zener diode 751 and current limiting resistor 756 to reduce a voltage applied between the drain and the source of N-channel FET 710 of any one of light source modules 701-704 having disconnection failure, it becomes possible to detect disconnection failure by a simple circuit configuration by disposing a series circuit of current limiting resistor 755 and photo-coupler 752 in parallel to current limiting resistor 756.

[1-2. Operation]
Operation of semiconductor light source driving apparatus 100 configured as described above will be described below.

(1) Detecting Operation of Disconnection Failure

Detecting operation of disconnection failure will be described with reference to a flowchart of FIG. 3.

Microcomputer 102 being a controller monitors a signal from open detection circuit 107. When microcomputer 102 decides based on the signal from open detection circuit 107, that none of semiconductor light source elements in light source modules 701-704 are in disconnection failure (No in step S11), microcomputer 102 controls a voltage to be applied to a series circuit of light source modules 701-704 and current detection resistor 106 so that a current flowing in current detection resistor 106 becomes a target value. Microcomputer 102 returns to step S11 again, and continues monitoring of a signal from open detection circuit 107.

When disconnection failure occurs in any one of semiconductor light source elements S being a light source element of any one of light source modules 701-704, zener diode 751 in the light source module which includes the semiconductor light source element S having the disconnection failure is turned on. Then, LED 753 being a light emitting element emits light, and phototransistor 754 being a light detecting element is turned on. By detecting that phototransistor 754 is turned on, open detection circuit 107 detects a light source module having the disconnection failure out of light source modules 701-704. Based on a signal from open detection circuit 107, microcomputer 102 can detect occurrence of the disconnection failure in the semiconductor light source element S of the light source module having the disconnection failure out of the plurality of light source modules 701-704. When microcomputer 102 decides based on the signal from open detection circuit 107 that the disconnection failure occurs in the semiconductor light source element S, (Yes in step S11), microcomputer 102 specifies a light source module that incorporates the semiconductor light source element S having the disconnection failure out of light source modules 701-704. Then, microcomputer 102 stores, in memory 104, information which indicates the light source module having the disconnection failure (step S12).

Upon detecting the occurrence of the disconnection failure in the semiconductor light source element S of the one of light source modules 701-704, microcomputer 102 temporarily turns off (suspends output of) DC power supply 108 for a light source by controlling DC power supply 108 (step S13).

Thereafter, by controlling FET driver drive circuit 103 being a switching element driving unit, microcomputer 102 selects the light source module having the disconnection failure out of light source modules 701-704, and turns on N-channel FET 710 (FET) of the selected light source module (step S14). Accordingly, the light source module that includes the semiconductor light source element S having the disconnection failure is short-circuited out of light source modules 701-704, and a state of the disconnection is canceled.

Thereafter, microcomputer 102 performs control of gradually raising the voltage of DC power supply 108 while checking such that the currents flowing in light source modules 701-704 and current detection resistor 106 becomes a target value (step S15). In this case, microcomputer 102 performs the process of step S11 in parallel with the raising of the voltage of DC power supply 108. By this arrangement, disconnection failure which occurs in the plurality of semiconductor light source elements S in a very short period can be also coped with.

If control of turning on N-channel FET 710 is performed without suspending DC power supply 108 for a light source, there is a possibility that, at a moment of turning on N-channel FET 710, a current equal to or larger than a current which any one of normal light source modules 701-704 can permit (an over-current) flows. Therefore, in the present exemplary embodiment, N-channel FET 710 (FET) is turned on in advance and thereafter the output voltage of the DC power supply is raised to prevent occurrence of an over-current.

However, in the case where the current that flows at the moment of turning on N-channel FET 710 (FET) has a current value equal to or smaller than a rated current value of N-channel FET 710 and semiconductor light source element S, it is not necessary to suspend DC power supply 108 for a light source, and the control of turning on FET 710 may be performed by keeping operating DC power supply 108 for a light source. In this case because it is not necessary to turn on/turn off DC power supply 108 for a light source, it becomes possible to further shorten the non-light emission time of the semiconductor light source.

(2) Operation at the Start of Semiconductor Light Source Driving Apparatus

Operation performed at start of semiconductor light source driving apparatus 100 will be described with reference to a flowchart of FIG. 4.

When starting semiconductor light source driving apparatus 100 and driving light source modules 701-704, N-channel FET 710 of any one of light source modules 701-704 which incorporates the semiconductor light source element S having the disconnection failure is turned on based on information previously stored in memory 104. This allows other light source modules 701-704 which have no disconnection failure to continuously emit light.

Specifically, microcomputer 102 first accesses memory 104, and reads the stored information (step S31). When memory 104 stores information of any one of light source modules (YES in S32), microcomputer 102, based on the information stored in memory 104, turns on in advance N-channel FET 710 of any one of light source modules 701-704 which incorporates the semiconductor light source element S having the disconnection failure (step S33). Thereafter, while checking the currents which flow in light source modules 701-704, microprocessor 102 performs control of gradually raising the voltage of DC power supply 108 (step S34). The reason for the control in this way will be described below.

If control of turning on N-channel FET 710 is performed after the voltage of DC power supply 108 is raised, there occurs a problem in that an over-current flows in other normal light source modules 701-704 at the moment of turning on N-channel FET 710.

Accordingly, in the present exemplary embodiment, N-channel FET 710 is turned on in advance, and thereafter, the output voltage of DC power supply 108 is raised to prevent occurrence of an over-current.

On the other hand, in the case where no information of light source modules 701-704 is stored in memory 104 (NO in S32), microcomputer 102 gradually raises the voltage of DC power supply 108, while checking the current which flows in light source modules 701-704 (step S34).

Figure 3:
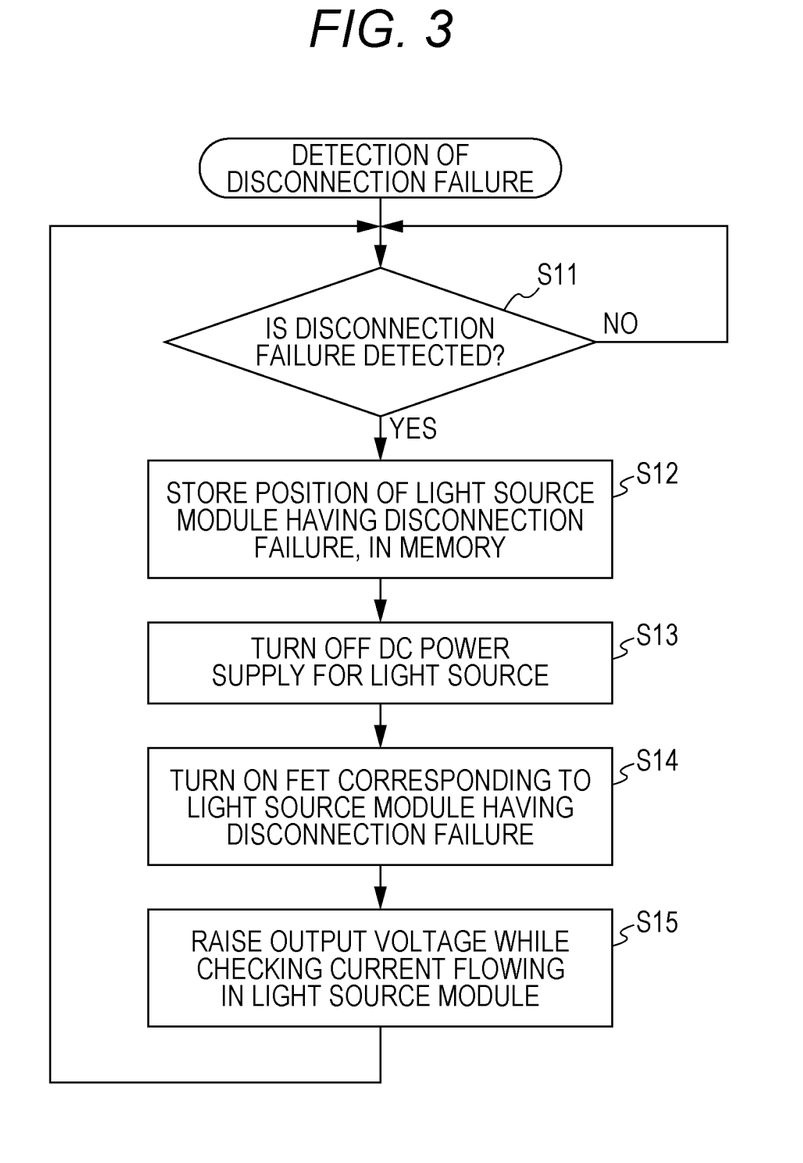
FIG. 3 is a flowchart of disconnection failure detection operation of the semiconductor light source driving apparatus according to the first exemplary embodiment.

In step S34, when a signal indicating any one of light source modules 701-704 having new disconnection failure is informed from open detection circuit 107, microcomputer 102 performs the process of the flowchart of FIG. 3, and short-circuits the one of light source modules 701-704 having the disconnection failure, and stores this information in memory 104.

According to semiconductor light source driving apparatus 100 of the present exemplary embodiment, when disconnection failure occurs in any one of light source modules 701-704, overvoltage detection circuit 750 can detect the disconnection failure and inform microcomputer 102 of the disconnection failure through open detection circuit 107. Then, in accordance with the information of the disconnection detection, microprocessor 102 can short-circuit the one of light source modules 701-704 by turning on N-channel FET 710 included in the one of light source modules 701-704 having the disconnection failure. Therefore, as compared with a configuration in which microcomputer 102 sequentially detects disconnection failure in a light source module unit, microcomputer 102 can detect disconnection failure and perform short-circuit in a shorter time so that a period during which entire light source unit 700 suspends light emission can be more shortened. Further, zener diode 751 can lower the voltage applied between the drain and the source of N-channel FET 710 at the time of a disconnection failure. Accordingly, N-channel FET 710 of a small breakdown voltage can be used, and loss in N-channel FET 710 can be reduced.

[1-3. Effects, Etc.]

As described above, semiconductor light source driving apparatus 100 of the present exemplary embodiment includes light source unit 700 having a plurality of series-connected light source modules 701-704. Each of light source modules 701-704 includes: N-channel FET 710 which is controlled to turn on/off by a control signal; a plurality of series-connected semiconductor light source elements S; and overvoltage detection circuit 750 in which zener diode 751 and LED 753 are connected in series and phototransistor 754 is disposed to face LED 753, N-channel FET 710, semiconductor light source elements S, overvoltage detection circuit 750 being connected in parallel to each other. Semiconductor light source driving apparatus 100 further includes: DC power supply 108 which supplies a DC voltage to light source unit 700; and FET driver drive circuit 103 which drives N-channel FET 710 of each of light source modules 701-704 to turn on/off N-channel FET 710. Further, semiconductor light source driving apparatus 100 includes microcomputer 102 which controls FET driver drive circuit 103 so that N-channel FET 710 included in any one of light source modules 701-704 is turned on according to detection of light from LED 753 performed by phototransistor 754 included in the same light source module.

According to such a configuration, semiconductor light source driving apparatus 100 of the present exemplary embodiment which drives a plurality of series-connected semiconductor light source elements S can continuously drive the semiconductor light source elements S, which have no disconnection failure, to emit light, even when one or more of the series-connected semiconductor light source elements S have disconnection failure. Further, unnecessary power consumption in the semiconductor light source element S having the failure can be reduced. Further, because detection of disconnection failure and short-circuiting can be performed in a shorter time, a period during which entire light source unit 700 suspends light emission can be more shortened.

Second Exemplary Embodiment

Figure 5:
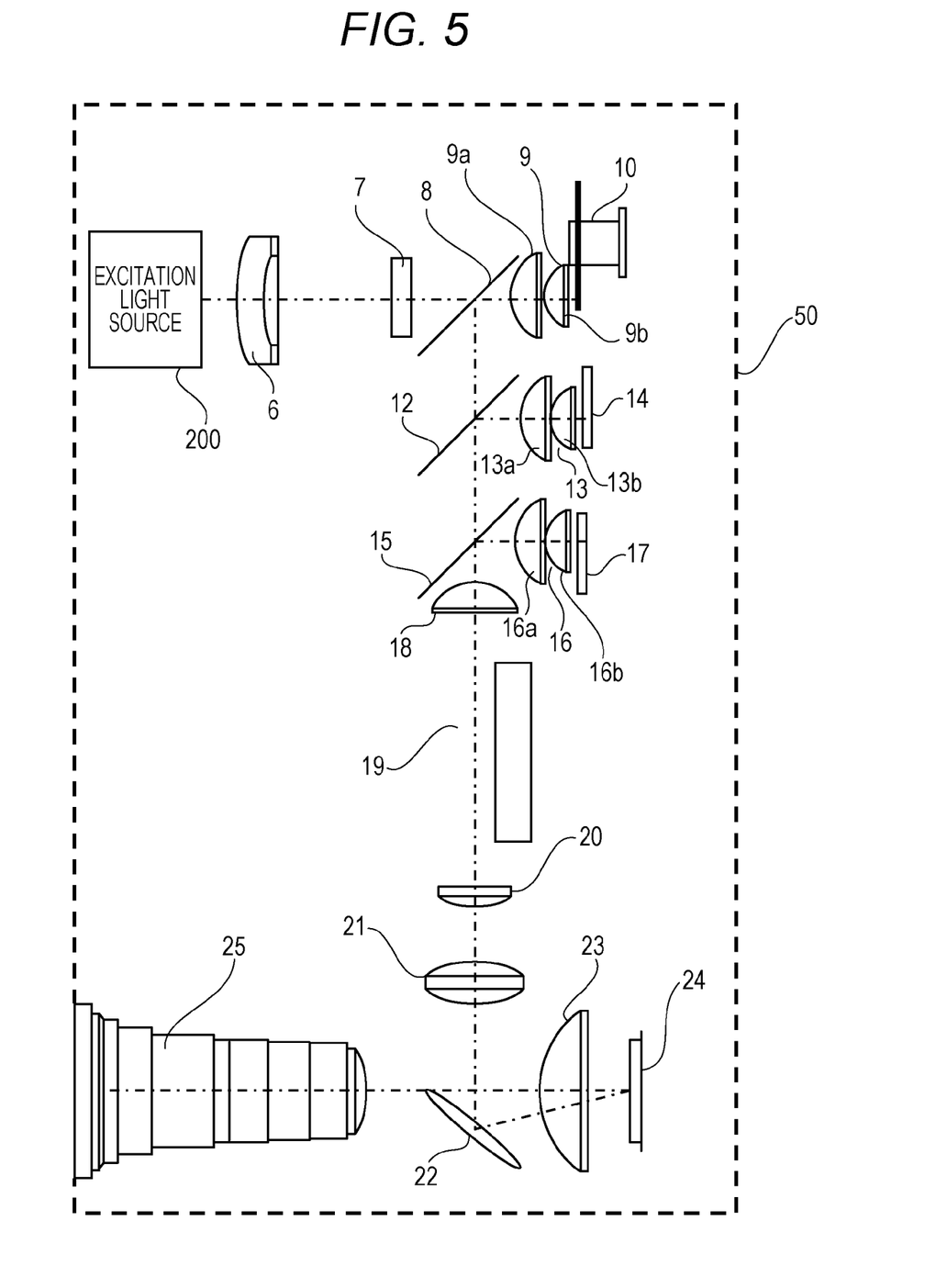
FIG. 5 is a diagram illustrating a configuration of a projection type display apparatus including the semiconductor light source driving apparatus according to the first exemplary embodiment.

Projection type display apparatus 50 including the semiconductor light source driving apparatus described in the above exemplary embodiment will be described. FIG. 5 is a diagram illustrating a configuration of projection type display apparatus 50 of the present exemplary embodiment.

Projection type display apparatus 50 includes excitation light source 200, DMD (Digital Mirror Device) 24, and projection lens 25. DMD 24 may be replaced by a liquid crystal display device.

Excitation light source 200 includes the semiconductor light source driving apparatus (not illustrated) described in the first exemplary embodiment. Excitation light source 200 includes a light emitting element (semiconductor light source element S) which emits blue light, and outputs blue excitation light.

Condenser lens 6 collects the blue light output from excitation light source 200. Blue excitation light exiting from condenser lens 6 enters lens 7. Lens 7 transforms the entered light into parallel light.

The blue excitation light exiting from lens 7 passes through dichroic mirror 8 which allows the blue light to pass therethrough and reflects green light. The blue excitation light enters condensing/collimating lens 9 which includes a pair of convex lenses 9a, 9b.

The green light excited by the excitation light and emitted from the green phosphor of phosphor wheel 10 enters condensing/collimating lens 9. The green light is collimated by condensing/collimating lens 9, and exits to dichroic mirror 8.

Dichroic mirror 8 reflects the green light from condensing/collimating lens 9, and leads the green light into dichroic mirror 12 which allows the green light to pass therethrough and reflects red light.

Collimating lens 13 includes a pair of convex lenses 13a, 13b. Red light emitting element 14 is disposed to face collimating lens 13, and emits red light. The red light from red light emitting element 14 is collimated by collimating lens 13, and exits to dichroic mirror 12.

The red light exiting from collimating lens 13 is reflected by dichroic mirror 12, and enters dichroic mirror 15 which allows the red light and the green light to pass therethrough and reflects the blue light.

Collimating lens 16 includes a pair of convex lenses 16a, 16b. Blue light emitting element 17 is disposed to face collimating lens 16, and emits the blue light. The blue light from blue light emitting element 17 is collimated by collimating lens 16, and exits to dichroic mirror 15.

In the above-described manner, light of three colors including the green light, the red light, and the blue light enter condenser lens 18. Specifically, the green light from phosphor wheel 10 is reflected by dichroic mirror 8, passes through dichroic mirrors 12, 15, and enters condenser lens 18. The red light exiting from red light emitting element 14 is reflected by dichroic mirror 12, passes through dichroic mirror 15, and enters condenser lens 18. The blue light exiting from blue light emitting element 17 is reflected by dichroic mirror 15, and enters condenser lens 18.

Condenser lens 18 collects the green light, the red light, and the blue light, and leads the collected light to one end face of rod integrator 19. The outgoing light exiting from the other end face of rod integrator 19 passes through relay lenses 20, 21, and then exits to total reflection mirror 22.

The light reflected by total reflection mirror 22 enters DMD 24 after passing through lens 23. DMD 24 modulates the entered light according to a video signal, and allows the modulated light to exit to projection lens 25 through lens 23. Projection lens 25 projects the entered light onto an external screen with enlarged image.

Projection type display apparatus 50 configured as described above can obtain effects similar to those described in the first exemplary embodiment concerning disconnection failure of the semiconductor light source element included in excitation light source 200.

Other Exemplary Embodiments

As described above, the exemplary embodiments are described as exemplification of techniques disclosed by the present application. However application of the techniques in the present disclosure is not limited to these embodiments, and the techniques can be also applied to embodiments where change, replacement, addition, and omission are suitably performed. Further, a new exemplary embodiment can be provided by combining the components described in the above exemplary embodiments.

Therefore, other exemplary embodiments will be described below.

(1) In the first exemplary embodiment, the light source module has a plurality of series-connected semiconductor light source elements. A number of semiconductor light source elements is not limited to the number as described above. The number of semiconductor light source elements included in one light source module does not need to be at least two, and may be one.

(2) In the first exemplary embodiment, an FET is described as an example of a unit for short-circuiting a semiconductor light source element. However, the unit for short-circuiting a semiconductor light source element is not limited to the FET. That is, the unit may be a switch which can form a new current path. For example, a relay may be used as the unit for short-circuiting a semiconductor light source element. In this case, loss of a light source module which does not emit light can be made substantially zero. Alternatively, a thyristor may be used as a unit for short-circuiting a semiconductor light source element. Using a thyristor has an advantage of simplifying control of ON/OFF.

(3) In the above description, detecting operation of disconnection failure is described with reference to the flowchart illustrated in FIG. 3 based on the assumption that none of semiconductor light source elements in light source modules 701-704 have disconnection failure. However, the operation described in the flowchart of FIG. 3 can be applied to a case where disconnection failure is already detected and also information of the disconnection failure is stored in memory 104. In this case, the operation described in the flowchart of FIG. 3 may be performed in a state that the FET of the light source module having the disconnection failure stored in memory 104 is turned on in advance.

(4) In the first exemplary embodiment, there is described a configuration in which FET 710 of light source module incorporating the semiconductor light source element S having disconnection failure is turned on based on the information stored in advance in memory 104 at the time of driving semiconductor light source modules 701-704 at start of semiconductor light source driving apparatus 100. According to the configuration of the first exemplary embodiment, even when the semiconductor light source element S has disconnection failure, the time during which light source unit 700 is not emitting light because of disconnection detection is very small. Therefore, semiconductor light source driving apparatus 100 may cause zener diode 751 to perform disconnection detection and cause FET 710 to perform short-circuit operation in each light source module at a starting time. However, light source unit 700 can start light emission earlier in the configuration in which FET 710 of the light source module incorporating the semiconductor light source element S having disconnection failure is turned on in advance. Therefore, this configuration is more desirable.

(5) In the first exemplary embodiment, there is described a configuration in which overvoltage detection circuit 750 includes current limiting resistor 756 connected in parallel to a series circuit of current limiting resistor 755 and LED 753. Overvoltage detection circuit 750 may be configured not to include current limiting resistor 756.

Figure 4:
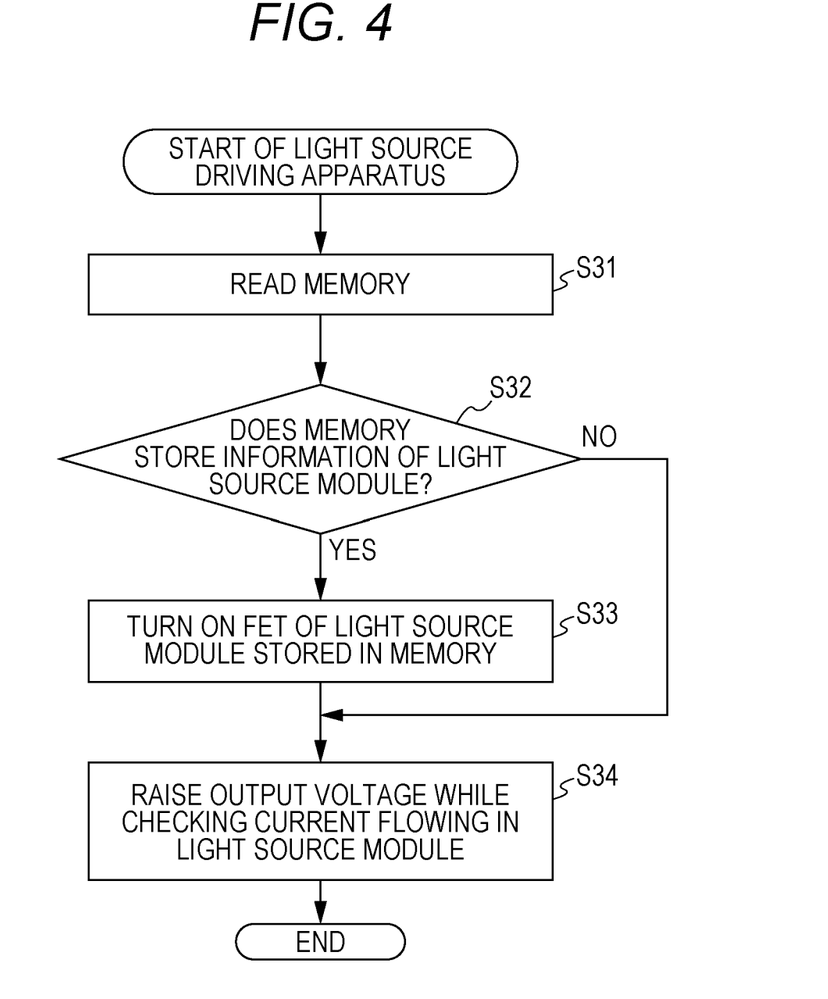
FIG. 4 is a flowchart of operation at start of the semiconductor light source driving apparatus according to the first exemplary embodiment.

(6) Although the operation described in the flowchart of FIG. 4 is performed at a starting of the semiconductor light source driving apparatus, the operation may be performed at other timing instead of the starting time. For example, the operation may be performed when a predetermined operation button (a reset button) is pressed.

(7) In the first exemplary embodiment, current detection circuit 105 and current detection resistor 106 are disposed at intermediate positions of the plurality of light source modules. However, current detection circuit 105 and current detection resistor 106 may be disposed at any portion of the series circuit of the plurality of light source modules.

Figure 6:
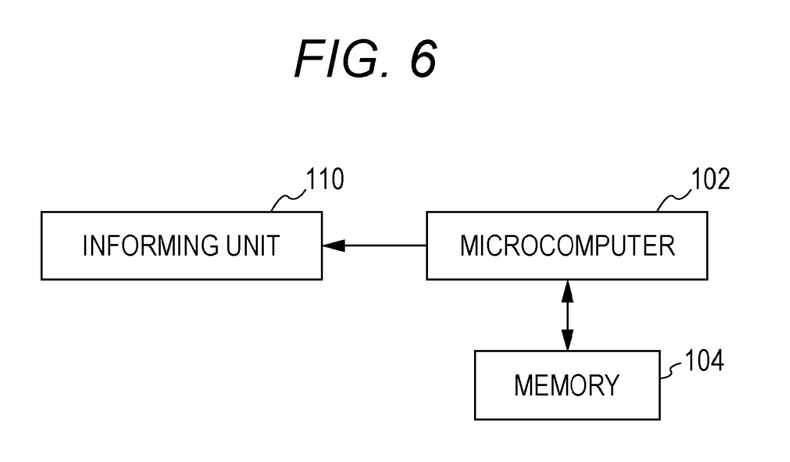
FIG. 6 is a diagram explaining an informing unit which informs a user of a state of disconnection failure in a semiconductor light source driving apparatus according to another exemplary embodiment.

(8) The semiconductor light source driving apparatus of each of the above exemplary embodiments may further include informing unit 110 that informs the user of occurrence of disconnection failure and/or a light source module having disconnection failure, as illustrated in FIG. 6. Informing unit 110 may be configured by an LED or a liquid crystal display device (LCD), for example. Informing unit 110 may inform the user of occurrence of disconnection failure or the like by audio output with a buzzer or a speaker.

(9) When a maximum current that flows at the FET on time is equal to or lower than a rated current of a part, power supply ON and OFF of FIG. 3 may be unnecessary.

As described above, the exemplary embodiments are described as exemplification of the techniques in the present disclosure. For this purpose, accompanying drawings and detailed descriptions are provided.

Therefore, components illustrated in the accompanying drawings and described in the detailed description may include not only components that are essential for solving problems but also other components that are not essential for solving the problem in order to exemplify the aforementioned techniques. Therefore, those non-essential components should not be immediately recognized as being essential based only on the fact that they are illustrated in the accompanying drawings and described in the detailed description.

Furthermore, since the purpose of the aforementioned exemplary embodiments is to give an example of the techniques in the present disclosure, various modifications, substitutions, additions, omissions, and the like may be implemented within a scope of the claims and equivalents thereto.

The present disclosure is applicable to a light source driving apparatus which drives a plurality of series-connected light source elements. Specifically, the present disclosure is applicable to a light source for a projector, a light source for a lighting apparatus, and so on.

What is claimed is:

1. A semiconductor light source driving apparatus comprising:
a light source unit which has a plurality of series-connected light source modules, each light source module of the plurality of series-connected light source modules including:
a switching element which is controlled to turn on/off by a control signal;
one or a plurality of series-connected light source elements; and
an overvoltage detection circuit in which a zener diode and a light emitting element are connected in series and a light detecting element is disposed to face the light emitting element,
the switching element, the light source elements, and the overvoltage detection circuit being connected in parallel to each other;
a direct current (DC) power supply which supplies a DC voltage to the light source unit;
a switching element driving unit which drives the switching element of each of the light source modules of the plurality of series-connected light source modules to turn on/off the switching element;
an open detection circuit connected to each overvoltage detection circuit; and
a controller which controls the switching element driving unit so that the switching element included in each of the light source modules of the plurality of series-connected light source modules is turned on according to detection of light by the light detecting element included in the same light source module of the plurality of series-connected light source modules.

2. The semiconductor light source driving apparatus according to claim 1, wherein
the open detection circuit detects which light source module of the plurality of series-connected light source modules has a disconnection failure, and
the controller determines the light source module of the plurality of series-connected light source modules that has the disconnection failure based on a disconnection detection signal from the open detection circuit.

3. The semiconductor light source driving apparatus according to claim 2, further comprising:
a non-transitory computer-readable memory,
wherein information which indicates the light source module of the plurality of series-connected light source modules having the disconnection failure is stored in the non-transitory computer-readable memory, and
the controller turns on in advance the switching element of the light source module of the plurality of series-connected light source modules indicated by the information, and thereafter performs control of gradually applying the DC voltage to the light source unit.

4. A projection type display apparatus comprising:
a semiconductor light source driving apparatus including:
a light source unit which has a plurality of series-connected light source modules, each light source module of the plurality of series-connected light source modules having:
a switching element which is controlled to turn on/off by a control signal;
one or a plurality of series-connected light source elements; and
an overvoltage detection circuit in which a zener diode and a light emitting element are connected in series and a light detecting element is disposed to face the light emitting element,
the switching element, the light source elements, and the overvoltage detection circuit being connected in parallel to each other;
a direct current (DC) power supply which supplies a DC voltage to the light source unit;

a switching element driving unit which drives the switching element of each of the light source modules of the plurality of series-connected light source modules to turn on/off the switching element;

an open detection circuit connected to each overvoltage detection circuit; and a controller which controls the switching element driving unit so that the switching element included in each of the light source modules of the plurality of series-connected light source modules is turned on according to detection of light by the light detecting element included in the same light source module of the plurality of series-connected light source modules.

5. The projection type display apparatus according to claim 4, further comprising:

an informing unit which informs occurrence of a disconnection failure and/or a light source module of the plurality of series-connected light source modules having a disconnection failure.

6. The projection type display apparatus according to claim 4, wherein the open detection circuit detects which light source module of the plurality of series-connected light source modules has a disconnection failure, and the controller determines the light source module of the plurality of series-connected light source modules that has the disconnection failure based on a disconnection detection signal from the open detection circuit.

7. The projection type display apparatus according to claim 6, further comprising:

a non-transitory computer-readable memory, wherein information which indicates the light source module of the plurality of series-connected light source modules having the disconnection failure is stored in the non-transitory computer-readable memory, and the controller turns on in advance the switching element of the light source module of the plurality of series-connected light source modules indicated by the information, and thereafter performs control of gradually applying the DC voltage to the light source unit.

* * * * *